(12) United States Patent
Mohamadi

(10) Patent No.: US 7,321,339 B2
(45) Date of Patent: Jan. 22, 2008

(54) PHASE SHIFTERS FOR BEAMFORMING APPLICATIONS

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 33 days.

(21) Appl. No.: 11/182,344

(22) Filed: Jul. 15, 2005

(65) Prior Publication Data

US 2006/0284783 A1 Dec. 21, 2006

Related U.S. Application Data

(63) Continuation-in-part of application No. 11/141,283, filed on May 31, 2005.

(60) Provisional application No. 60/643,989, filed on Jan. 14, 2005.

(51) Int. Cl.
*H01Q 21/00* (2006.01)
(52) U.S. Cl. .............................. 343/853; 343/700 MS
(58) Field of Classification Search ......... 343/700 MS, 343/853, 850, 876, 795
See application file for complete search history.

(56) References Cited

U.S. PATENT DOCUMENTS

| | | | | |
|---|---|---|---|---|
| 5,404,581 | A * | 4/1995 | Honjo | 455/90.1 |
| 6,020,853 | A * | 2/2000 | Richards et al. | 343/700 MS |
| 6,195,047 | B1 * | 2/2001 | Richards | 343/700 MS |
| 6,441,787 | B1 * | 8/2002 | Richards et al. | 343/700 MS |
| 6,559,798 | B1 * | 5/2003 | Marumoto et al. | 342/372 |
| 6,828,556 | B2 * | 12/2004 | Pobanz et al. | 250/336.1 |
| 7,151,494 | B2 * | 12/2006 | Brown et al. | 343/700 MS |
| 2002/0122004 | A1 * | 9/2002 | Richards et al. | 343/700 MS |
| 2002/0126048 | A1 * | 9/2002 | Zhu et al. | 343/700 MS |
| 2006/0033663 | A1 * | 2/2006 | Saint Clair et al. | 343/700 MS |

OTHER PUBLICATIONS

F. Mohamadi, "Si Integration With Millimeter Wave Phased Array Antenna," RF Design, Feb. 2004, pp. 40-48.
C. Goldsmith et al., "Micromechanical Membrane Switches For Microwave Applications", 1995 IEEE MTT-S Dig., pp. 91-94.
A. Malczewski et al., "X-Band RF MEMS Phase Shifters For Phased Array Applications", IEEE Microwave and Guided Wave Letters, vol. 9, Dec. 1999, pp. 517-519.
B. Kleveland et al.,"Exploiting CMOS Reversed Interconnect Scaling in Multigigahertz . . . ," IEEE Journal of Solid-State Circuits, Oct. 2001, pp. 1480-1488.
J. Hayden et al., "Very Low-Loss Distributed X-Band and Ka-Band MEMS . . . ", IEEE Transactions on Microwave Theory and Techniques, vol. 51, No. 1, Jan. 2003, pp. 309-314.
B. Pillans et al., "Ka-Band RF MEMS Phase Shifters," IEEE Microwave and Guided Wave Letters, vol. 9, No. 12, Dec. 1999, pp. 520-522.
H. Kim et al., "A Compact V-Band 2-Bit Reflection-Type MEMS Phase Shifter", IEEE Microwave and Wireless Components Letters, vol. 12, No. 9, Sep. 2002, pp. 324-326.

* cited by examiner

*Primary Examiner*—Hoanganh Le
(74) *Attorney, Agent, or Firm*—Jonathan W. Hallman; MacPherson Kwok Chen & Heid LLP

(57) ABSTRACT

In one embodiment, an integrated circuit antenna array is provided that includes: a substrate, a plurality of antennas adjacent the substrate; and an RF feed network adjacent the substrate for transmitting RF signals to the plurality of antennas and for receiving RF signals from the plurality of antennas, the RF feed network coupling to a distributed plurality of phase shifters integrated with the substrate for phase-shifting the RF signals propagated through the RF feed network.

14 Claims, 18 Drawing Sheets

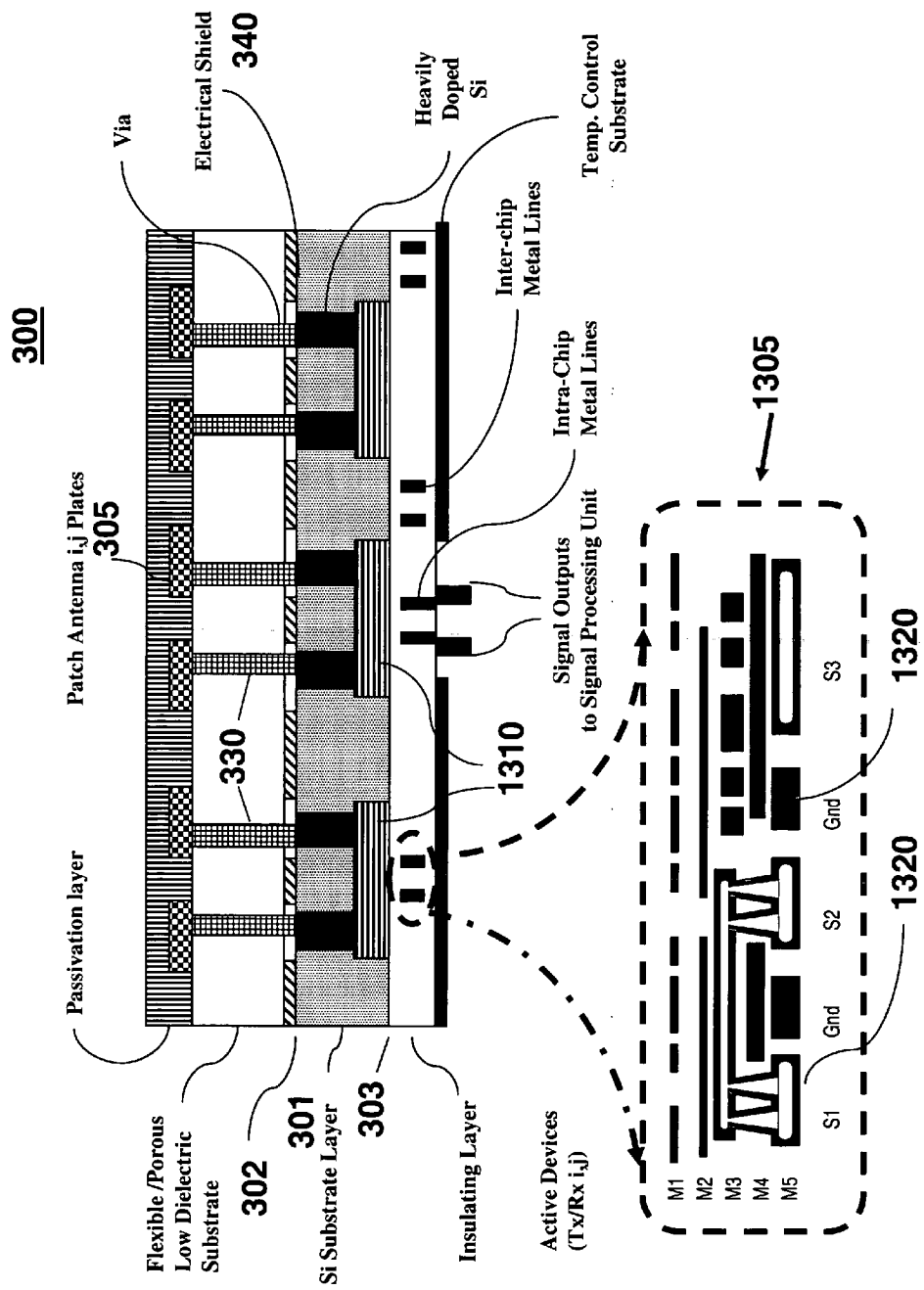
Fig. 12.a

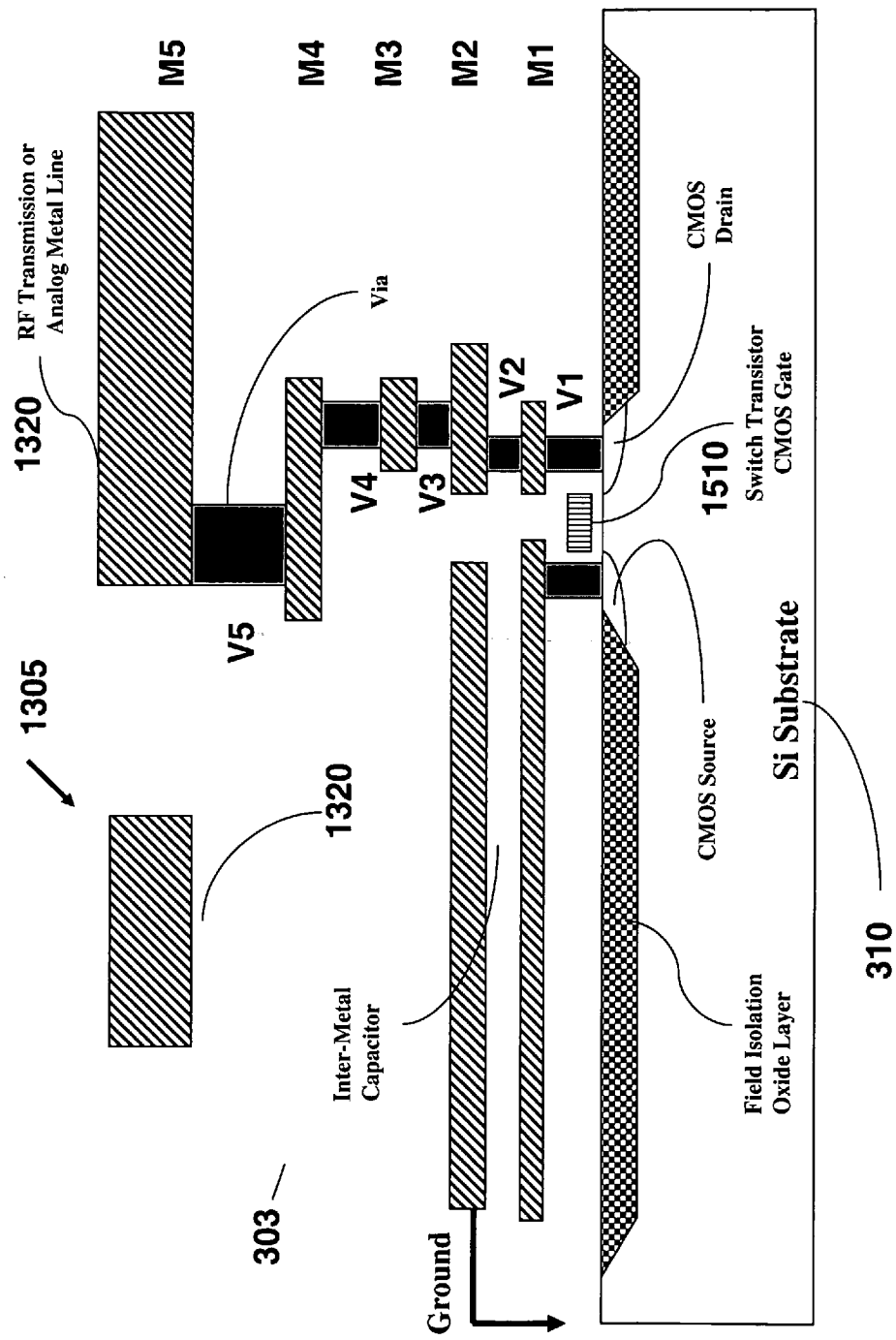
Fig. 12.b

PHASE SHIFTERS FOR BEAMFORMING APPLICATIONS

RELATED APPLICATIONS

This application is a Continuation-In-Part of U.S. Ser. No. 11/141,283, entitled "Wafer Scale Beam Forming Antenna Module With Distributed Amplification," filed May 31, 2005. In addition, this application claims the benefit of U.S. Provisional Application No. 60/643,989, filed Jan. 14, 2005. The contents of both the aforementioned applications are hereby incorporated by reference in their entirety.

TECHNICAL FIELD

The present invention relates generally to antennas, and more particularly to a wafer scale beamforming antenna array having distributed phase-shifters.

BACKGROUND

Conventional high-frequency antennas are often cumbersome to manufacture. In particular, conventional beamforming antenna arrays require complicated feed structures and phase-shifters that are impractical to be implemented in a semiconductor-based design due to its cost, power consumption and deficiency in electrical characteristics such as insertion loss and quantization noise levels. In addition, such beamforming arrays become incompatible with digital signal processing techniques as the operating frequency is increased. For example, at the higher data rates enabled by high frequency operation, multipath fading and cross-interference becomes a serious issue. Adaptive beamforming techniques are known to combat these problems. But adaptive beamforming for transmission at 10 GHz or higher frequencies requires massively parallel utilization of A/D and D/A converters.

To address the need in the art for improved beamforming antenna arrays, the present inventor disclosed beamforming antenna arrays compatible with wafer scale integration in U.S. Ser. No. 11/074,027, filed Mar. 7, 2005, now U.S. Pat. No. 7,126,542. and U.S. Ser. No. 11/049,098, filed Feb. 2, 2005, now U.S. Pat. No. 7,126,541. the contents of both of which are hereby incorporated by reference. These applications utilized and expanded upon the beam forming capabilities disclosed by the present inventor in U.S. Ser. No. 10/423,303, filed Apr. 25, 2003, now U.S. Pat. No. 6,885,344, U.S. Ser. No. 10/423,160, filed Apr. 25, 2003, now U.S. Pat. No. 6,870,503 and U.S. Ser. No. 10/422,907, filed Apr. 25, 2003, Ser. No. 10/423,129, filed Apr. 25, 2003, now U.S. Pat. No. 6,963,307, Ser. No. 10/860,526, filed Jun. 3, 2004, now U.S. Pat. No. 6,982,670, and Ser. No. 10/942,383, filed Sep. 16, 2004, the contents of all of which are hereby incorporated by reference in their entirety.

One embodiment of a beamforming antenna system described in the above-mentioned applications is shown in FIG. 1, which illustrates an integrated RF beamforming and controller unit 130. In this embodiment, the receive and transmit antenna arrays are the same such that each antenna 170 functions to both transmit and receive. A plurality of integrated antenna circuits 125 each includes an RF beamforming interface circuit 160 and receive/transmit antenna 170. RF beamforming interface circuit 160 adjusts the phase and/or the amplitude of the received and transmitted RF signal responsive to control from a controller/phase manager circuit 190. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

A circuit diagram for an exemplary embodiment of RF beamforming interface circuit 160 is shown in FIG. 2. Note that the beamforming performed by beamforming circuits 160 may be performed using either phase shifting, amplitude variation, or a combination of both phase shifting and amplitude variation. Accordingly, RF beamforming interface circuit 160 is shown including both a variable phase shifter 200 and a variable attenuator 205. It will be appreciated, however, that the inclusion of either phase shifter 200 or attenuator 205 will depend upon the type of beamforming being performed. To provide a compact design, RF beamforming circuit may include RF switches/multiplexers 210, 215, 220, and 225 so that phase shifter 200 and attenuator 205 may be used in either a receive or transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The resulting shifted signal routes through RF switch 225 to RF switch 210. RF switch 210 then routes the signal to IF processing circuitry (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beamforming interface circuit 160 may be constructed not including switches 210, 220, and 225 such that the receive and transmit paths do not share phase shifter 200 and/or attenuator 205. In such embodiments, RF beamforming interface circuit 160 would include separate phase-shifters and/or attenuators for the receive and transmit paths.

To assist the beamforming capability, a power detector 250 functions as a received signal strength indicator to measure the power in the received RF signal. For example, power detector 250 may comprise a calibrated envelope detector. Referring back to FIG. 1, a power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beamforming direction may simply be commanded by controller/phase manager 190 rather than derived from a received signal. In such embodiment, power manager 150 and power detectors 250 need not be included since phasing information will not be derived from a received RF signal.

Regardless of whether integrated antenna circuits 125 perform their beamforming using phase shifting and/or amplitude variation, the shifting and/or variation is performed on the RF signal received either from the IF stage (in a transmit mode) or from its antenna 170 (in a receive mode). By performing the beamforming directly in the RF domain as discussed with respect to FIGS. 1 and 2, substantial savings are introduced over a system that performs its beamforming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beamforming is performed in the RF domain. The injection of phase and/or attenuation control signals by controller/phase manager circuit 190 into each integrated antenna circuit 125 may be performed inductively as discussed in U.S. Pat. No. 6,963,307.

Examination of FIG. 1 shows that a network is necessary for the distribution of the RF signals to and from the IF stage to integrated antenna units 125 as well as to and from RF beamforming interface circuits 160 and their corresponding antenna(s) 170. U.S. Pat. No. 7,126,542 discloses a micro-waveguide network for distributing these RF signals. Because of the use of waveguide transmission, very low transmissions losses were thereby introduced into the distributed RF signals. Moreover, the micro-waveguide network was compatible with wafer scale integration of the resulting beamforming array.

A wafer scale integrated antenna module (WSAM) as disclosed in U.S. Pat. No. 7,126,542 may include three primary layers. The first layer would be a semiconductor substrate, such as Si. On a first surface of the substrate, antennas such as patches for the integrated antenna circuits are formed as discussed, for example, in U.S. Pat. No. 6,870,503. Active circuitry for the corresponding integrated antenna circuits that incorporate these antennas on formed on a second opposing surface of the substrate. A micro-waveguide transmission network such as a rectangular waveguide network is formed adjacent this second opposing surface. The second layer would include the antennas on the first side of the substrate whereas the third layer would include the rectangular waveguide network. Thus, the WSAM includes the "back side" feature disclosed in U.S. Ser. No. 10/942,383 in that the active circuitry and the antennas are separated on either side of the substrate. In this fashion, electrical isolation between the active circuitry and the antenna elements is enhanced. Moreover, the ability to couple signals to and from the active circuitry is also enhanced.

Adjacent to the opposing second surface is the micro-waveguide distribution network. This network carries the RF signals to and from the antennas as discussed above. Thus, the network also distributes RF signals to and from the IF processing stage (or direct down-conversion stage depending upon the receiver architecture).

The network comprises waveguides that may be formed using metal layers in a semiconductor process such as CMOS as discussed in, for example, U.S. Ser. No. 10/423, 160. However, it will be appreciated the waveguide diameter is then limited by maximum separation achievable between metal layers in such semiconductor processes. Typically, the maximum achievable waveguide diameter would thus be 7 microns or less, thereby limiting use of the waveguide to frequencies above 40 GHz. To accommodate lower frequency operation, micro-machined waveguides may also be utilized.

As discussed in U.S. Ser. No. 10/942,383, a heavily doped deep conductive junction through the substrate couples the active circuitry to vias/rods at the first substrate surface that in turn couple to the antenna elements. Formation of the junctions is similar to a deep diffusion junction process used for the manufacturing of double diffused CMOS (DMOS) or high voltage devices. It provides a region of low resistive signal path to minimize insertion loss to the antenna elements.

Upon formation of the junctions in the substrate, the active circuitry may be formed using standard semiconductor processes. The active circuitry may then be passivated by applying a low temperature deposited porous SiOx and a thin layer of nitridized oxide (SixOyNz) as a final layer of passivation. Thickness of these sealing layers may range from a fraction of a micron to a few microns. The opposing second surface may then be coated with a thermally conductive material and taped to a plastic adhesive holder to flip the substrate to expose the first surface. The substrate may then be back ground to reduce its thickness to a few hundreds of micro-meters.

An electric shield may then be sputtered or alternatively coated using conductive paints on background surface. A shield layer over the electric field may form a reflective plane for directivity and also shields the antenna elements. In addition, parts of the shield form ohmic contacts to the junctions. For example, metallic lumps may be deposited on the junctions. These lumps ease penetration of the via/rods to form ohmic contacts with the active circuitry.

The network may be formed in a glass, metallic, oxide, or plastic-based insulating layer. Depending upon the desired propagation frequency in the network, the thickness of the substrate may range from a few millimeters to multiple tens of microns. A rectangular or circular cavity is then etched into the insulating layer to form a waveguide cavity. The walls of the cavity may then be metallically coated using silver, copper, aluminum, or gold to provide the waveguide boundaries. Each integrated antenna circuit (FIGS. 1 and 2) will need a feedline/receptor to couple to the network as discussed, for example, in U.S. Pat. No. 7,126,541. Each feedline/receptor may be formed from a discrete metallic part such as a base pin that is inserted into the metallic lumps described above to form ohmic contacts to the active circuitry analogous to the insertion of the rods/vias. A metallic plate may then be used to seal the waveguide cavities to complete the micro-waveguide network. Because the network is metallic, it also may function as a heat sink for cooling the active circuitry.

Although this WSAM advantageously suffers relatively very little loss in signal propagation through the micro-waveguide network, the antenna array capacity is impacted by the relative size necessary for each waveguide chamber. In general, such chambers need to be approximately ½ wavelength across as known in the waveguide arts. In turn, however, this minimum width requirement limits the number of antennas that may be integrated into a single wafer as each antenna would require (ultimately) its own waveguide.

To address the need in the art for wafer scale beamforming antenna arrays that have improved array density, U.S. Ser. No. 11/141,283 discloses a beamforming antenna array in which the micro-waveguide network disclosed in U.S. Pat. No. 7,126,542 is replaced by either a coplanar or microstrip waveguide network. In this fashion, the pitch between adjacent conductors in the network is substantially reduced. However, the accompanying transmission losses are thereby substantially increased. For example, consider the losses at 40 GHz. A rectangular waveguide (such as disclosed in U.S. Pat. No. 7,126,542) has losses of less than 0.001 dB/mm at this frequency. However, microstrip and coplanar waveguides (CPWs) have losses of approximately 10 to considerably more than 100 times greater. For example, a thin field CPW network has losses of above 0.1 dB/mm at this frequency. To obtain the array density benefits of a CPW or microstrip network while obtaining satisfactory power transfer through the network, U.S. Ser. No. 11/141,283 discloses distributed amplifiers that may be integrated with the network.

Although the beamforming antenna array disclosed in U.S. Ser. No. 11/141,283 thereby obtains a high-density antenna array with sufficient gain provided by the distributed amplifiers, phase shifters are required to provide beam steering capabilities. Beam steering using electronic phase shifters has several advantages over mechanically-steered antennas. Phased array antennas are lighter in weight, more agile, and induce no angular momentum to a satellite as would be the case for a mechanically-steered antenna as the beam is redirected. Phased array antennas have traditionally used MMIC (Monolithic Microwave Integrated Circuits) phase shifters, which have two shortcomings: they can contribute substantially to the cost of fabrication and also tend to introduce a relatively high insertion loss. MEMS-controlled phase shifters have recently been demonstrated that show promise in lowering MMIC-induced cost and insertion loss. In addition, MEMS-based phase shifters have lower parasitics and higher linearity. However, a MEMS-based approach suffers from a lack of integration with the state-of-art Si technology.

Accordingly, there is a need in the art for improved phased array antenna architectures.

SUMMARY

In accordance with one aspect of the invention, an integrated circuit antenna array is provided that includes: a substrate, a plurality of antennas adjacent the substrate; and an RF feed network adjacent the substrate for transmitting RF signals to the plurality of antennas and for receiving RF signals from the plurality of antennas, the RF feed network coupling to a distributed plurality of phase shifters integrated with the substrate for phase-shifting the RF signals propagated through the RF feed network.

The invention will be more fully understood upon consideration of the following detailed description, taken together with the accompanying drawings.

BRIEF DESCRIPTION OF THE DRAWINGS

FIG. 12a is a cross-sectional view of an integrated antenna circuit having a coplanar waveguide RF feed network in accordance with an embodiment of the invention.

FIG. 12b is a cross-sectional view of an integrated capacitor for a distributed phase shifter in the integrated antenna circuit of FIG. 12a.

FIG. 13 is a plan view of a portion of the coplanar waveguide RF feed network of FIG. 12a.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To address the need in the art for improved phased array antenna architectures a distributed low noise amplifier integrated with either a CPW or microstrip network as discussed in U.S. Ser. No. 11/141,283 is coupled with novel phase shifters as described further herein.

Figure 4:
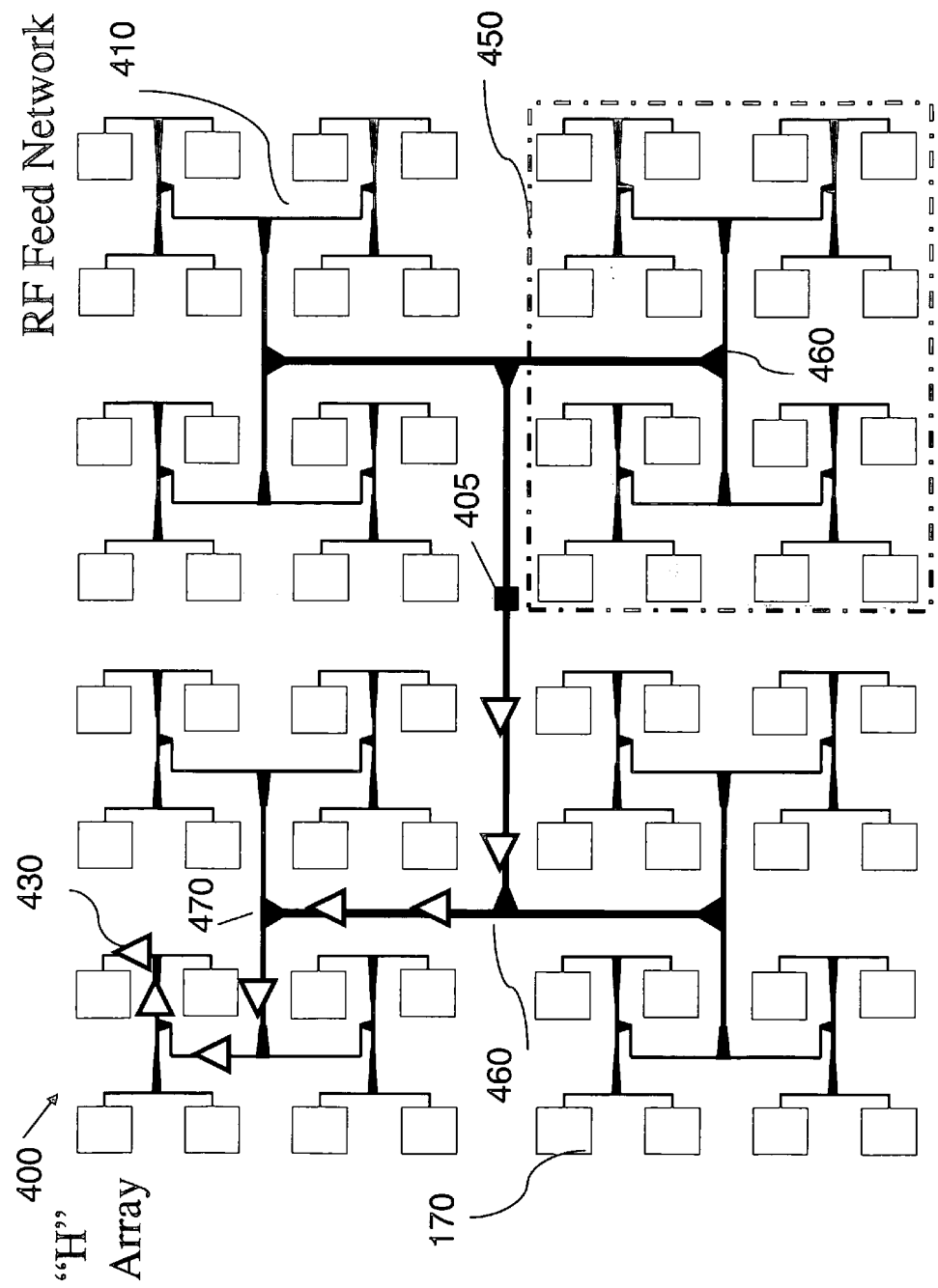
FIG. 4 is a plan view of a wafer scale beamforming antenna array module and its associated transmission network in accordance with an embodiment of the invention.
Figure 5:
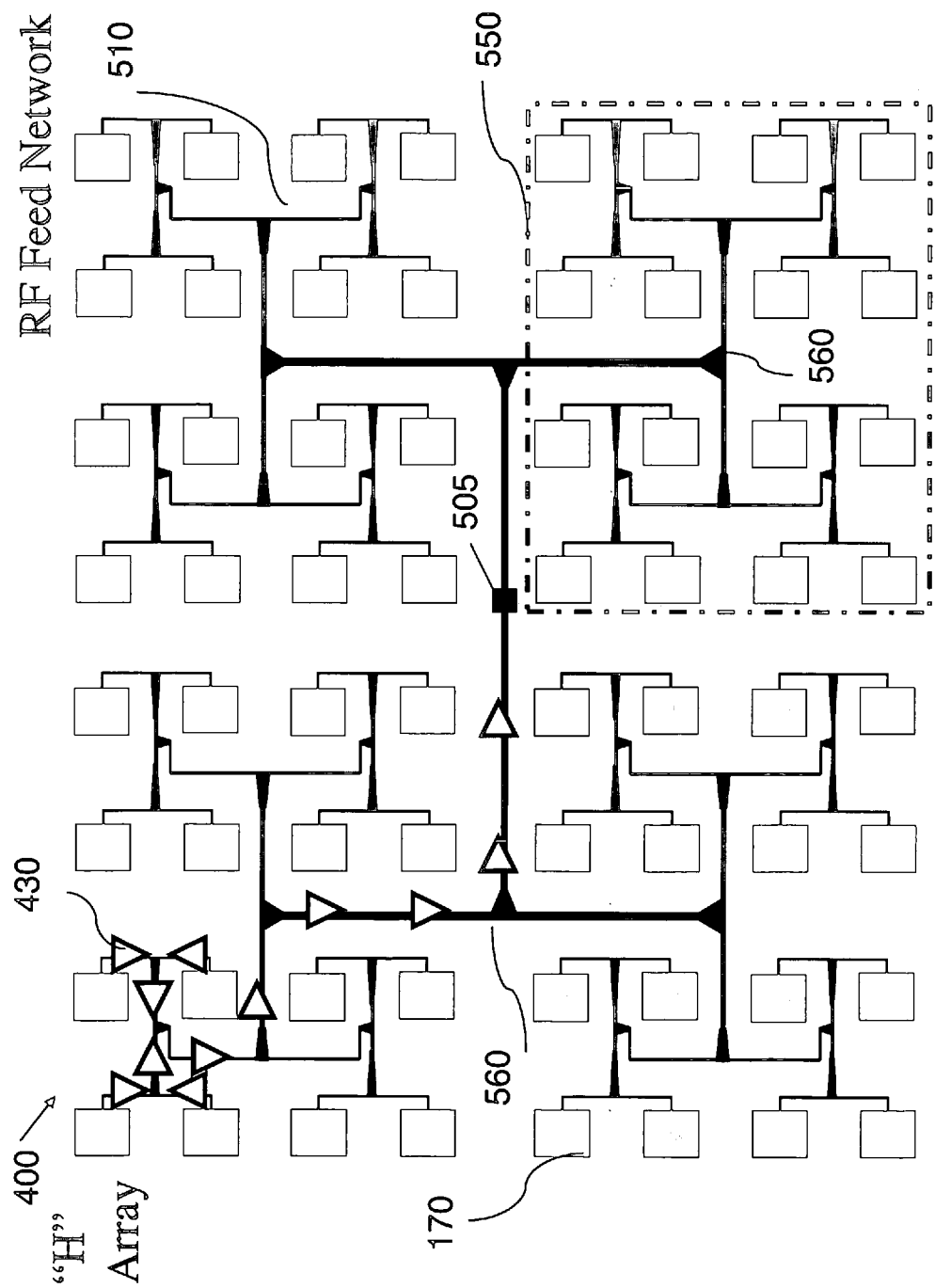
FIG. 5 is a plan view of a wafer scale beamforming antenna array module and its associated receiving network in accordance with an embodiment of the invention.

A view of an 8" wafer scale antenna module 400 having 64 antenna elements 170 is illustrated in FIGS. 4 and 5. The CPW network transmitting RF signals to and from each antenna element may be in either a half-duplex of full-duplex configuration. A half-duplex transmission network 410 is illustrated in FIG. 4. From a center feed point 405, transmission network 410 couples to every antenna element 170. For such an array, the transmission distance from feed point 405 to any given antenna element may be approximately 120 mm, which is close to four wavelengths at 10 Ghz. Should network 410 be implemented using CPW, the transmission losses can thus exceed 120 dB. Although the scope of the invention includes the use of any suitable architecture for network 410 such as CPW, microstrip, and planar waveguide, CPW enjoys superior shielding properties over microstrip. Thus, the following discussion will assume without loss of generality that network 410 is implemented using CPW. A half-duplex receiving CPW network 510 for wafer scale antenna module 400 having 64 antenna elements 170 is illustrated in FIG. 5.

Figure 1:
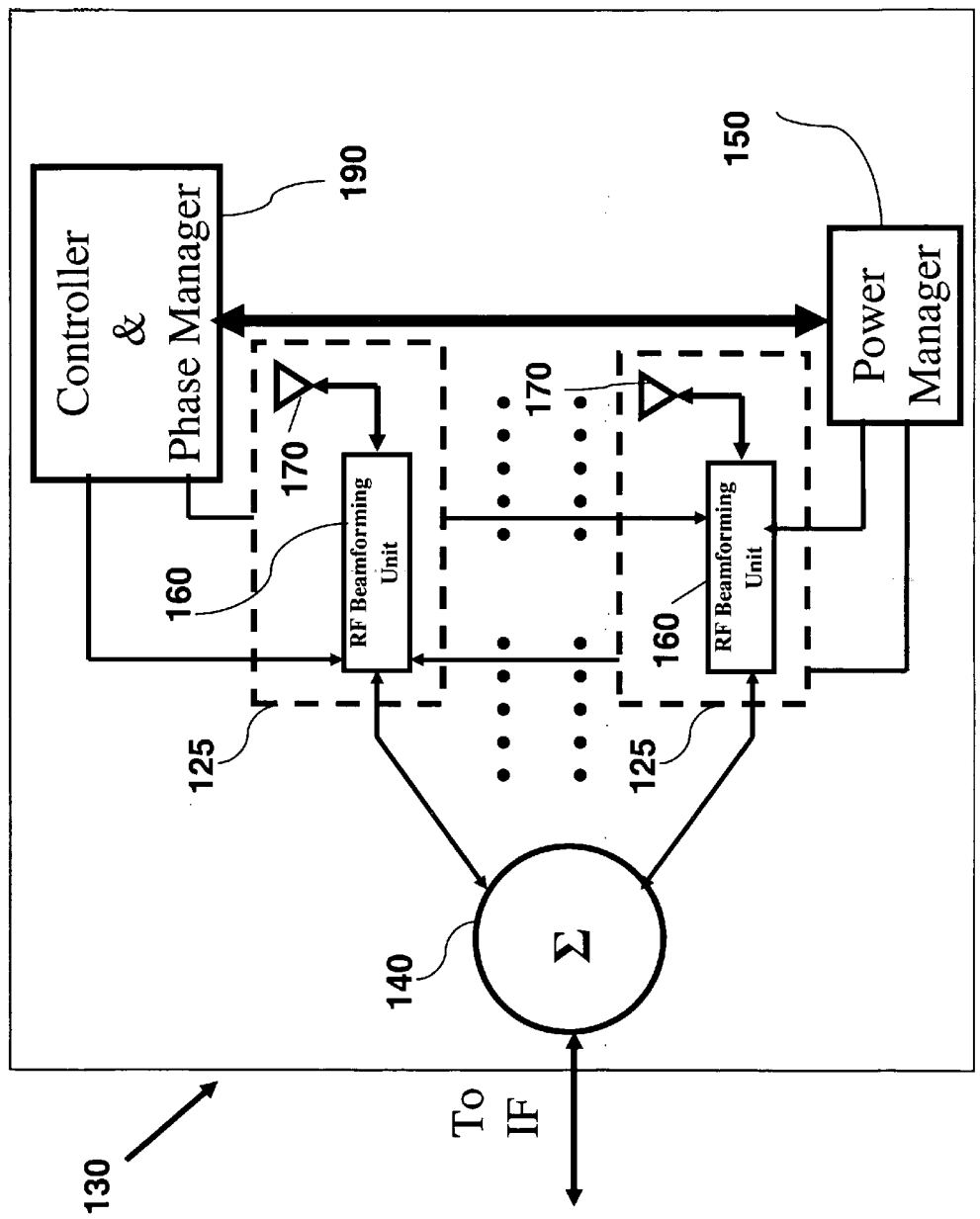
FIG. 1 is a block diagram of a beamforming antenna array in which the beamforming is performed in the RF domain.
Figure 2:
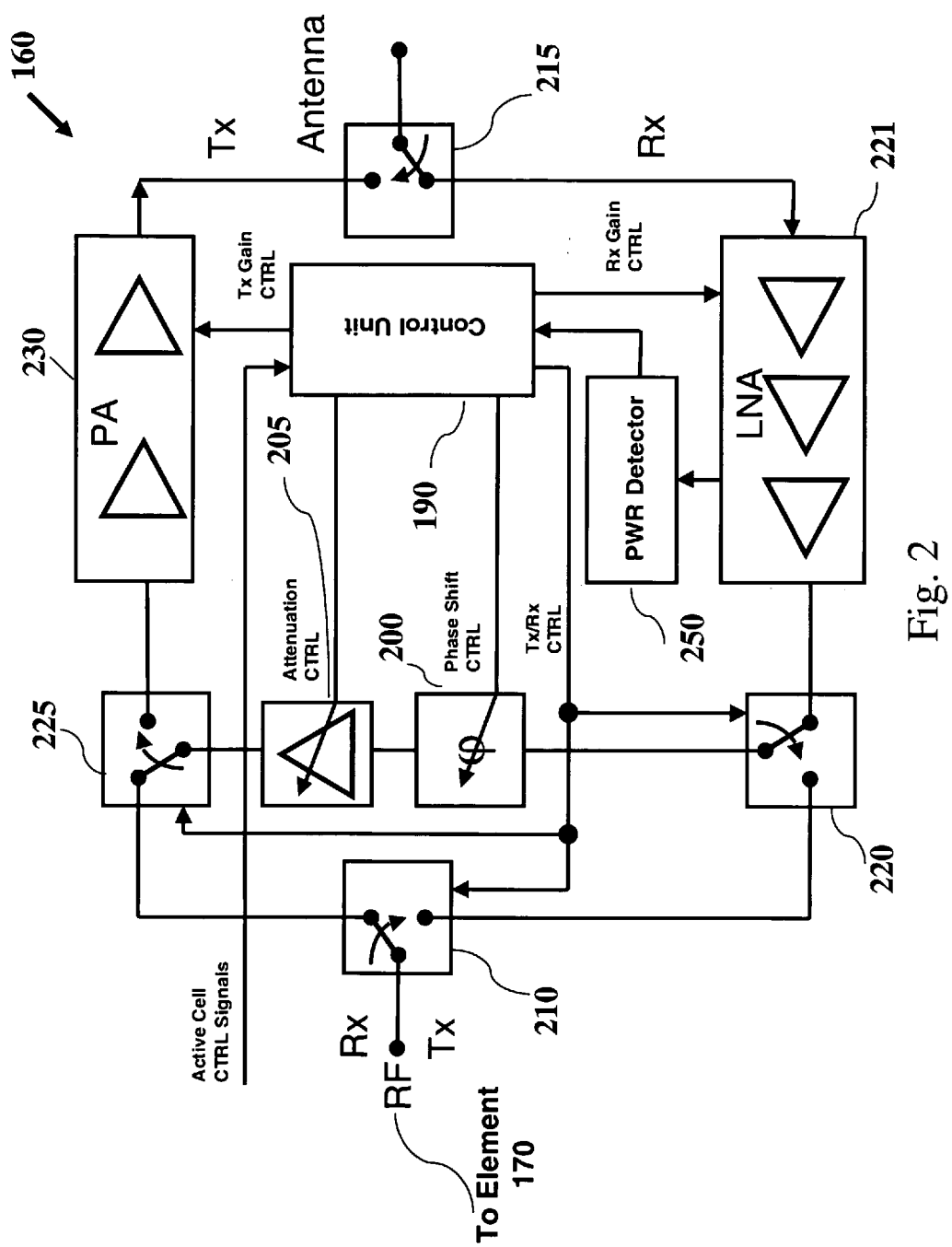
FIG. 2 is a schematic illustration of an RF beamforming interface circuit for the array of FIG. 1.
Figure 3:
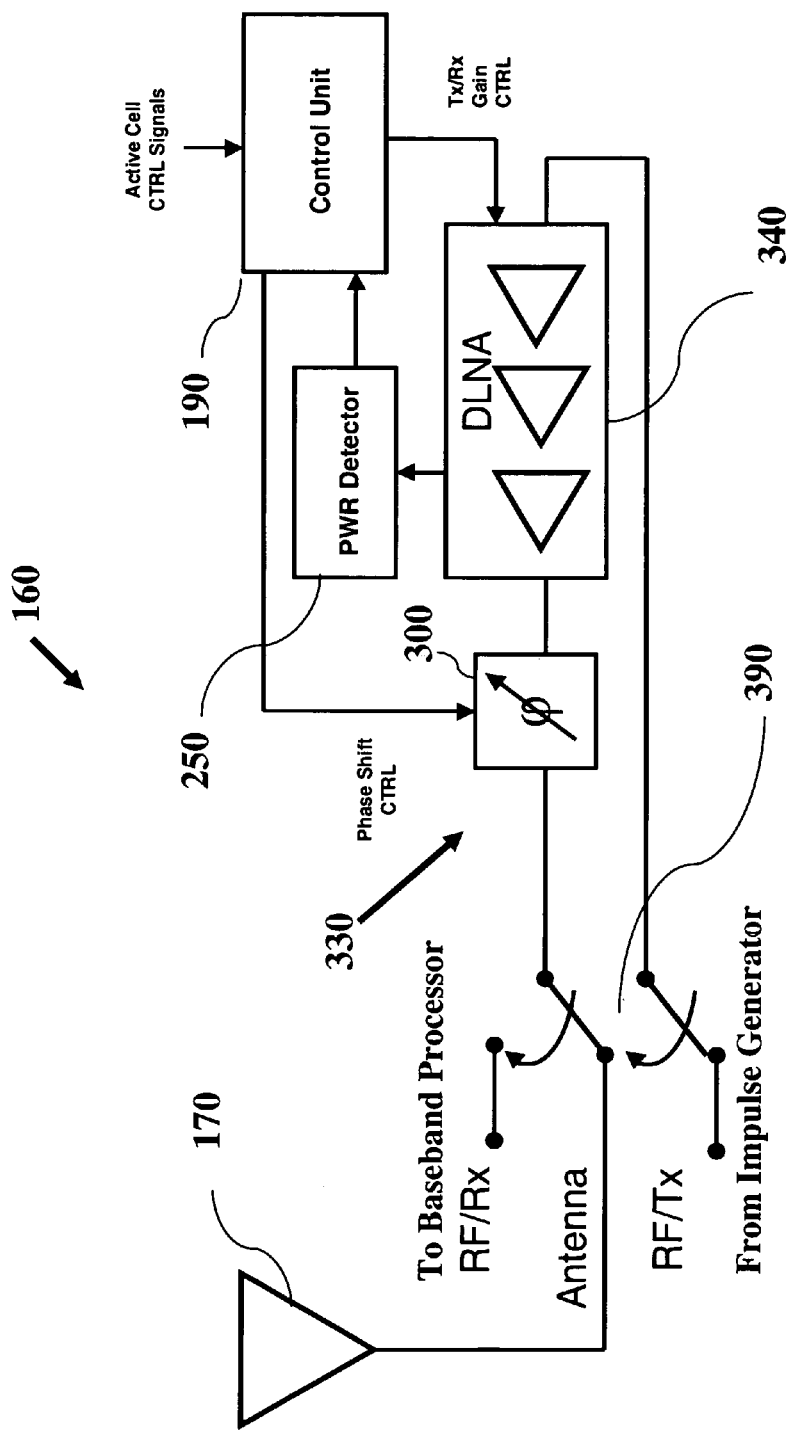
FIG. 3 is a high-level schematic illustration of an RF beamforming interface circuit including a distributed phase shifter and a distributed amplifier in accordance with an embodiment of the invention.

The present invention enables the use of such a lossy, yet advantageous for array density, network such as that illustrated in FIGS. 4 and 5 through the inclusion of distributed amplifiers as well as distributed phase shifters. Referring now to FIG. 3, an exemplary arrangement of a distributed low noise amplifier (DLNA) 340 and a distributed phase shifter 300 for an RF beamforming circuit 160 is illustrated. In the embodiment illustrated, a CPW network 330 is full-duplex. However, it will be appreciated that the half-duplex arrangement discussed with respect to FIGS. 4 and 5 may also be used. To accommodate full-duplex transmission, RF switches 390 select for either a receiving or transmitting mode. In the illustrated transmitting mode, a signal generator such as, for example, an RF impulse generator provides an RF signal to DLNA 340. In turn, DLNA 340 provides its amplified signal to distributed phase shifter 300 so that the amplified signal may be phase shifted according to commands from control unit 190. In the receiving mode, RF switches 390 are configured so that a received RF signal from antenna 170 couples through DLNA 340 and phase shifter 300 to a baseband processor. As discussed earlier, a power detector 250 may be used to determine the "master" antenna based upon received power for beam steering purposes. The implementations of phase shifter 300 and DLNA 340 will be discussed further in greater detail.

Figure 6:
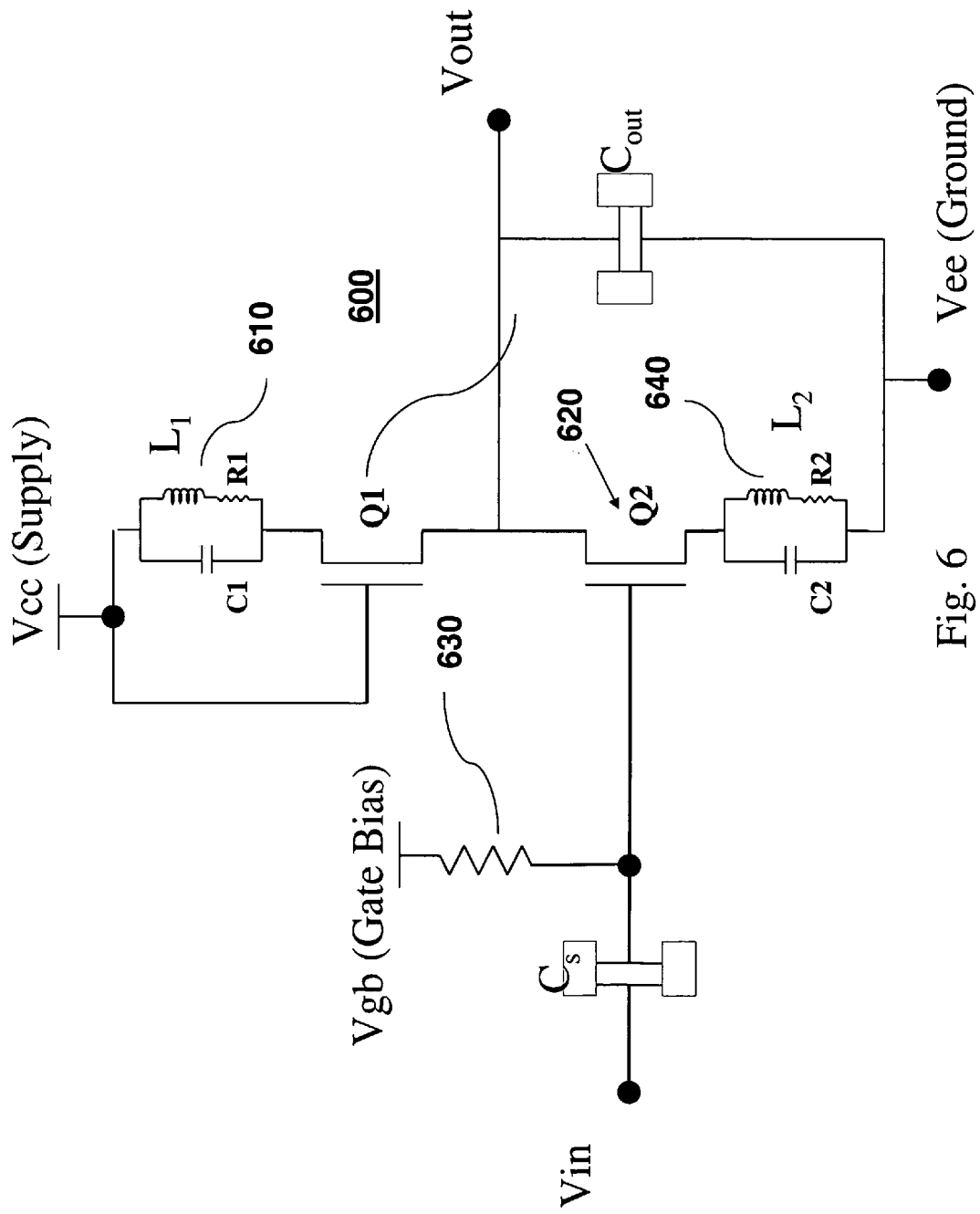
FIG. 6 is a schematic illustration of a matching amplifier in accordance with an embodiment of the invention.

The network may be single-ended or differential. In one embodiment, the network may comprise a coplanar waveguide (CPW) having a conductor width of approximately 4 microns. With such a small width or pitch to the network, an first array of 64 antenna elements and a second array of 1024 antenna elements may be readily networked in an 8 inch wafer substrate for 10 GHz and 40 GHz operation, respectively. The distributed LN amplifiers will be described first, followed by a discussion of the distributed phase shifters. In one embodiment, a driving amplifier in the network is followed by a matching amplifier for efficient performance. An exemplary embodiment of a FET-based matching amplifier 600 is illustrated in FIG. 6. Amplifier 600 couples to a coplanar waveguide network (not illustrated) at input port Vin and output port Vout. An analogous BJT-based architecture may also be implemented. The FETs may be either NMOS or PMOS. A first NMOS FET Q1 605 has its drain coupled through an integrated inductor (L1) 610 to a supply voltage Vcc. This integrated inductor L1 may be formed using metal layers in a semiconductor process as discussed in U.S. Pat. No. 6,963,307. Because such an integrated inductor L1 will also have a stray capacitance and resistance, these stray effects are modeled by capacitor C1 and resistor R1. The metal layers in the semiconductor process may also be used to form a DC blocking capacitor $C_s$ and an output capacitor $C_{out}$. The supply voltage also drives the gate of Q1. Q1 has its source driving Vout as well as a drain of a second NMOS FET Q2 620. A voltage source coupled through a high value resistor 630 or configured transistor (not illustrated) biases the gate of Q2 620 with a voltage Vgb. The source of Q2 620 couples to ground through an inductor (L2) 640. Analogous to inductor 610, inductor 640 has its stray capacitance and resistance modeled by capacitor C2 and resistor R2. It may be shown that an input resistance Rin for amplifier 600 is as follows:

$Rin=(gm)*L2/Cgs$ where gm is the transconductance for Q2 620, L2 is the inductance of the inductor 640 and Cgs is the gate-source capacitance for Q2 620. Thus, Q2 620 and inductor 640 characterize the input impedance and may be readily designed to present a desired impedance. For example, if an Rin of 50 Ω is desired, Q2 620 channel dimensions and inductor 640 may be designed accordingly.

Figure 7:
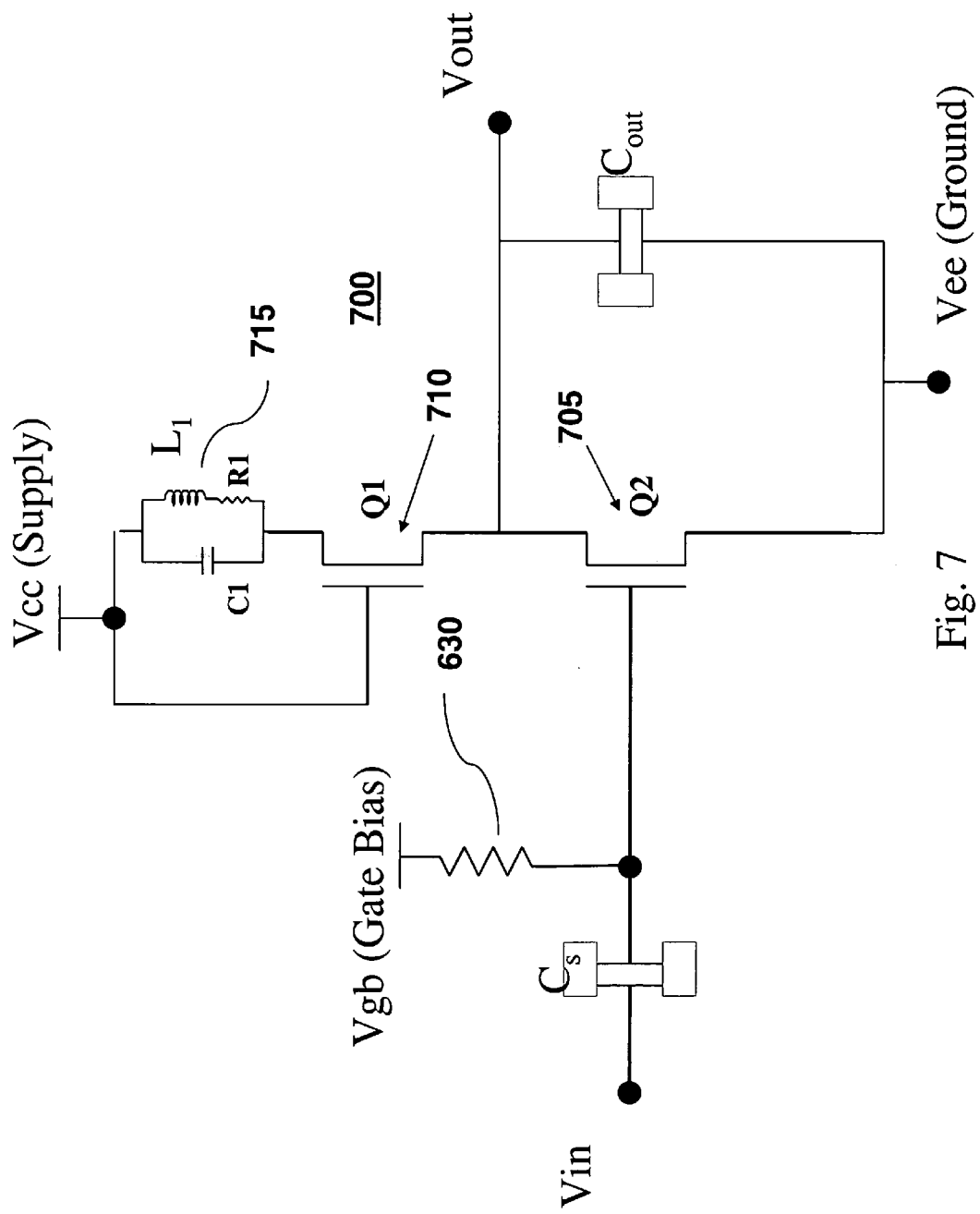
FIG. 7 is a schematic illustration of a driving amplifier in accordance with an embodiment of the invention.

An exemplary driving amplifier 700 is illustrated in FIG. 7. Driving amplifier 700 is constructed analogously to matching amplifier 600 except that no inductor loads the source of Q2 705. A Q1 710 has its drain loaded with an integrated inductor 715 analogously to Q1 605 of matching amplifier 600. Inductor 715 determines a center frequency Fd for driving amplifier 700 whereas both inductors 640 and 610 establish a resonant frequency Fm for matching amplifier 600. It may be shown that the band-pass center frequency Fc of a series-connected driving and matching amplifier is given as $Fc=\frac{1}{2}*sqrt(Fd^2+Fm^2)$ Referring back to FIG. 4, a series of driving amplifier/matching amplifier pairs 430 are shown coupling feed point 405 to a first network intersection 460. In such an "H" configured network array, network 410 will continue to branch from intersection 460 such as at an intersection 470. For a half-duplex embodiment, driving amplifier/matching amplifier pairs 430 may also be incorporated in receiving network 510 as seen in FIG. 5. For illustration clarity, the distribution of the driving amplifier/matching amplifier pairs 430 is shown only in selected transmission paths in FIGS. 4 and 5.

Figure 8:
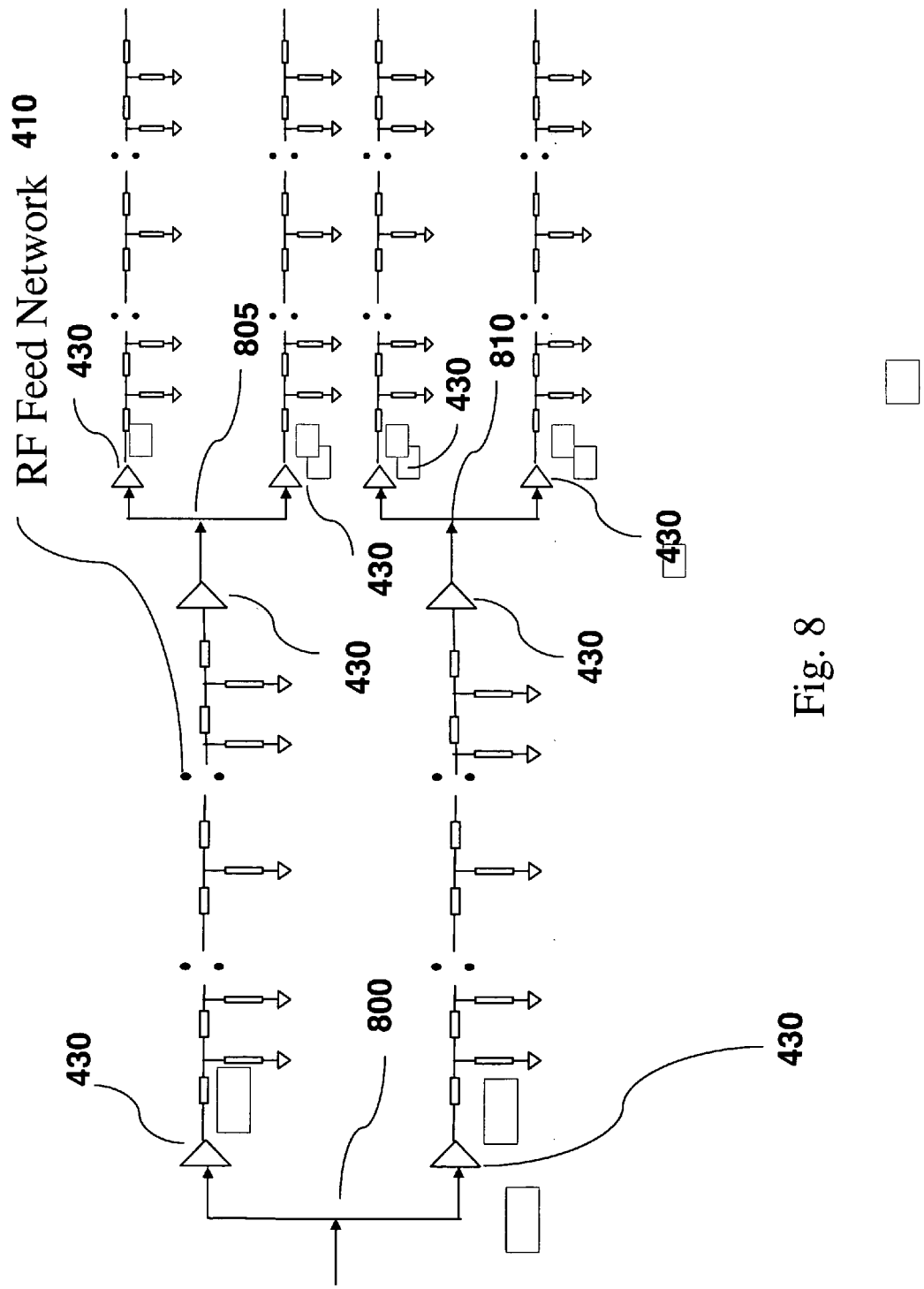
FIG. 8 illustrates a distributed amplification arrangement with respect to a splitting junction in accordance with an embodiment of the invention.

Turning now to FIG. 8, a single driving amplifier/matching amplifier pair 430 may both precede and follow network branching intersections 800, 805, and 810 in transmission network 410. Alternatively, just a single pair 430 may drive each branching intersection. It will be appreciated that the same considerations apply to a receiving (and hence combining) network. Indeed, the same network may be used for both transmission and reception in a half-duplex design. In a full duplex, separate transmit and receive RF feed networks should be used to avoid interference.

Figure 9:
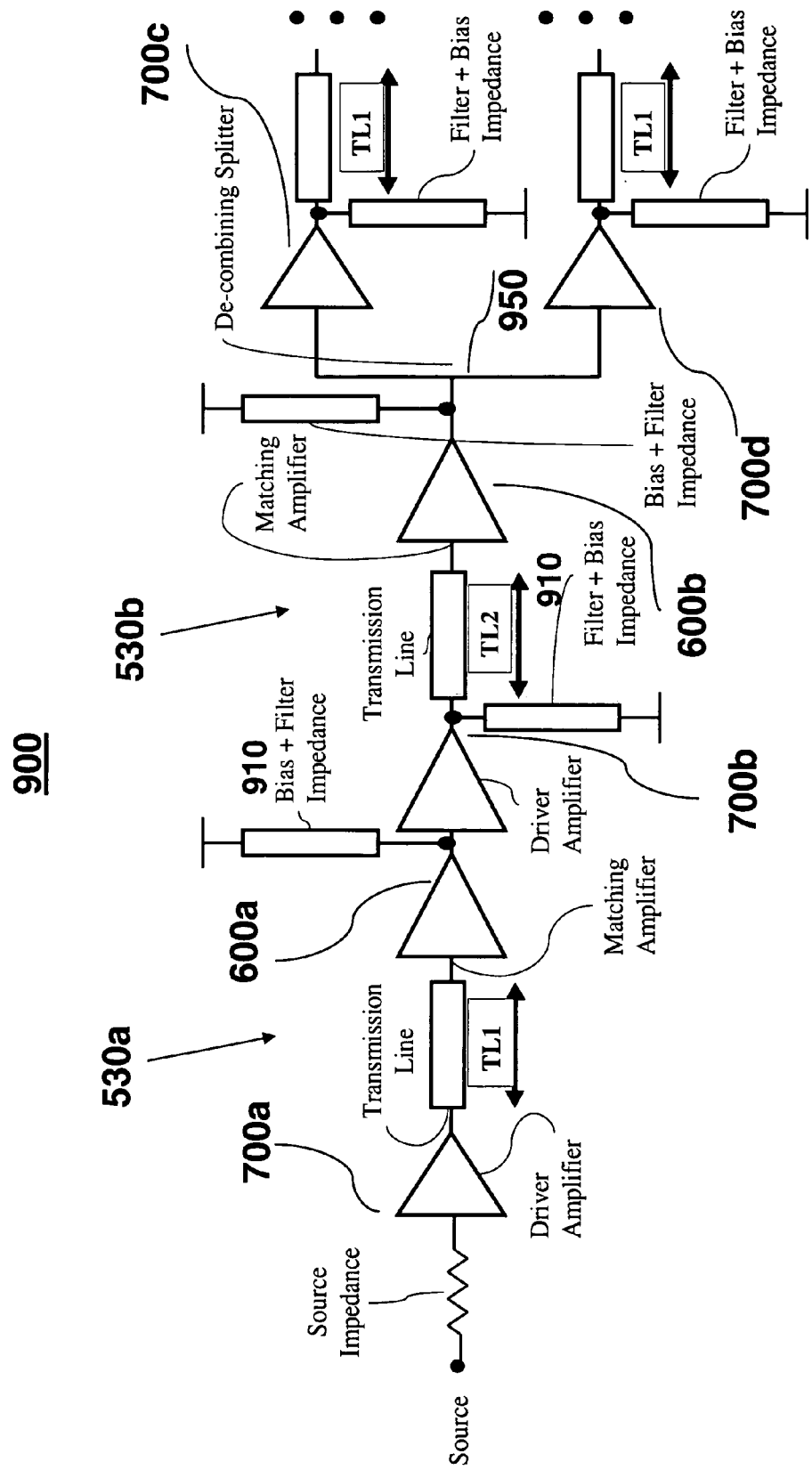
FIG. 9 illustrates a distributed amplification arrangement with respect to a splitting junction in accordance with an embodiment of the invention.

Network properties are influenced by the distance between driving amplifiers and matching amplifiers in successive driving amplifier/matching amplifier pairs. For example, as seen for RF network portion 900 in FIG. 9, its input or source is received at a first driver amplifier 700a, which drives a matching amplifier 600a separated from driver 700a by a length of network transmission line (such as coplanar waveguide) of length TL1. Driver amplifier 700a and matching amplifier 600a thus constitute a first driving amplifier/matching amplifier pair 530a, which may also be denoted as a load balanced amplifier (LBA). Matching amplifier 600a is immediately followed by a driver amplifier 700b, which couples to the output of matching amplifier 600a directly in the active circuitry silicon rather than through a transmission line section. In this fashion, die space on the wafer substrate is conserved. However, it will be appreciated that an RF network CPW transmission line segment could also be used to couple matching amplifier 600*a* to driving amplifier 700*b*. Driver amplifier 700*b* drives a matching amplifier 600*b* separated from driver 700*b* by a length TL2 of network transmission line. Driver amplifier 700*b* and matching amplifier 600*b* thus form a second driving amplifier/matching amplifier 530*b*. The necessary biasing and inductance loading as described with respect to FIGS. 6 and 7 are represented by bias and filter impedances 910. In general, the sum of TL1 and TL2 should equal one half of the center frequency wavelength. By changing the ratio of TL1/TL2 and the output capacitance, a maximum stable gain of approximately 20 to 30 dB may be obtained for 10 GHz to, for example, 40 GHz operation. Stable gain and frequency performance may be seen for a capacitance load of 50 fF as TL1/TL2 is varied from 40% to 80%.

In prior art RF distribution networks splitting and combining signals was problematic and involved cumbersome combiner or splitter circuitry. However, note the simplicity involved for the coupling of matching amplifier 600*b* through a splitting junction 950 to driver amplifiers 700*c* and 700*d*. This coupling occurs through a node in the active circuitry substrate to conserve wafer substrate area. However, this substrate coupling may be replaced by a CPW transmission line segment in alternative embodiments. As compared to prior art splitters, not only is there no loss coupling through splitting junction 950, but there is a gain instead. Moreover, transmission through the RF feed network is low loss and low noise because the driver and matching amplifiers are tuned with reactive components only—no resistive tuning (and hence loss) need be implemented.

Figure 10:
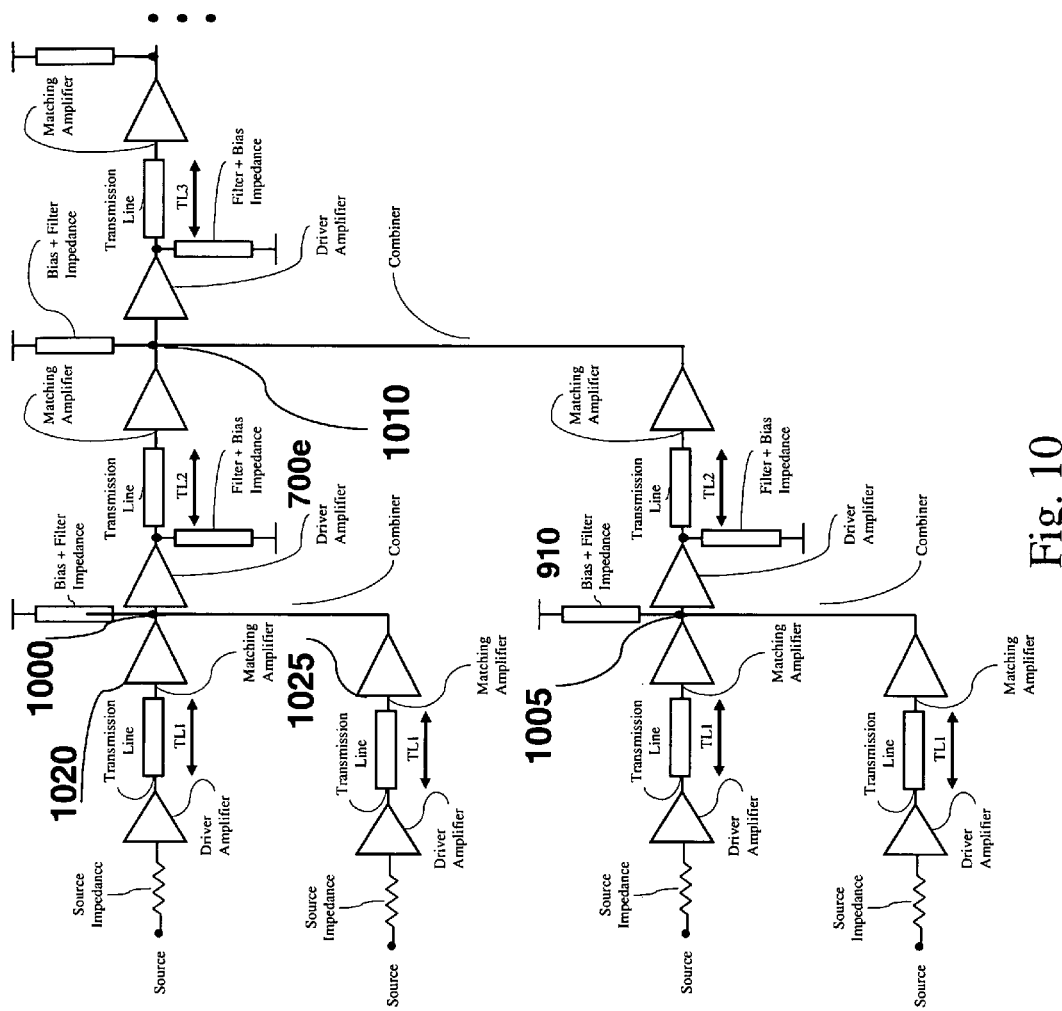
FIG. 10 illustrates a distributed amplification arrangement with respect to a combining junction in accordance with an embodiment of the invention.
Figure 11:
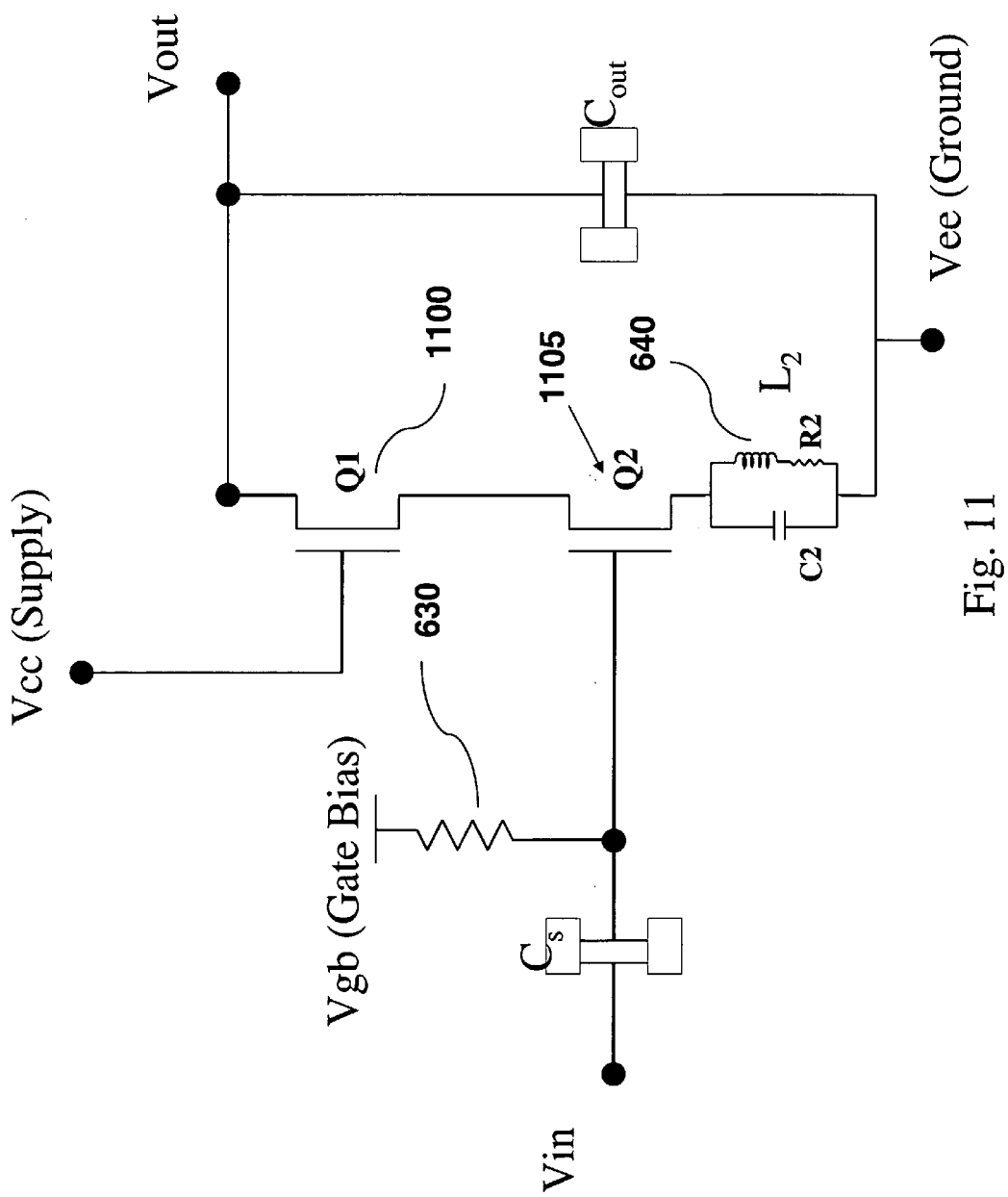
FIG. 11 is a schematic illustration of a matching amplifier for a combining junction in accordance with an embodiment of the invention.

The same low loss and simplicity of design advantages are present with respect to combining junction 1000, 1005, and 1010 as seen in FIG. 10. For example, with respect to junction 1000, two combiner matching amplifiers 1020 and 1025 couple through a node in the active circuitry substrate to a driving amplifier 700*e* to conserve wafer substrate area. However, it will be appreciated that a CPW transmission line segment may be used to perform this coupling in alternative embodiments. Bias and filter impedance 910 is thus shared by both combiner matching amplifiers. Turning now to FIG. 11, a combiner matching amplifier is distinguished from a non-combiner matching amplifier such as discussed with respect to FIG. 6 by absence of L1 at the drain of a FET Q1 1100, which provides Vout. Output capacitor $C_{out}$ thus is the only load for Q1's drain. A FET Q2 1105 has its drain loaded by the matching inductor 640 for impedance matching as discussed with respect to FIG. 6. A common load inductor (not illustrated) couples to output node Vout to uniformly load all the involved combiner matching amplifiers.

The CPW RF feed network with distributed amplifiers and distributed phase shifters may be integrated onto the "backside" of the substrate as discussed above with respect to a micro-waveguide network. Alternatively, the CPW network may be integrated on the antenna side of the substrate. Because the backside approach has the isolation and coupling advantages described previously, the following discussion will assume without loss of generality that the RF feed network is integrated with the substrate in a backside embodiment. For example as seen in cross-section in FIG. 12*a*, a semiconductor substrate 301 has opposing surfaces 302 and 302. Antenna elements 305 are formed adjacent surface 302. Active circuitry 1310 integrated with substrate 301 includes the driving and matching amplifiers for an RF feed network 1305 having CPW conductors S1 and S2. Adjacent surface 303, metal layer M1 includes inter-chip and other signal lines. Metal layer M2 forms, among other things, a ground plane for CPW conductors S1 and S2, which are formed in metal layer 5 as well as ground plates 1320. Metal layer M4 provides a connecting layer to couple CPW conductors together as necessary. The driving and matching amplifiers within active circuitry 1310 couple through vias (not illustrated) in apertures in the ground plane in metal layer M2 to CPW conductors S1 and S2.

Figure 13:
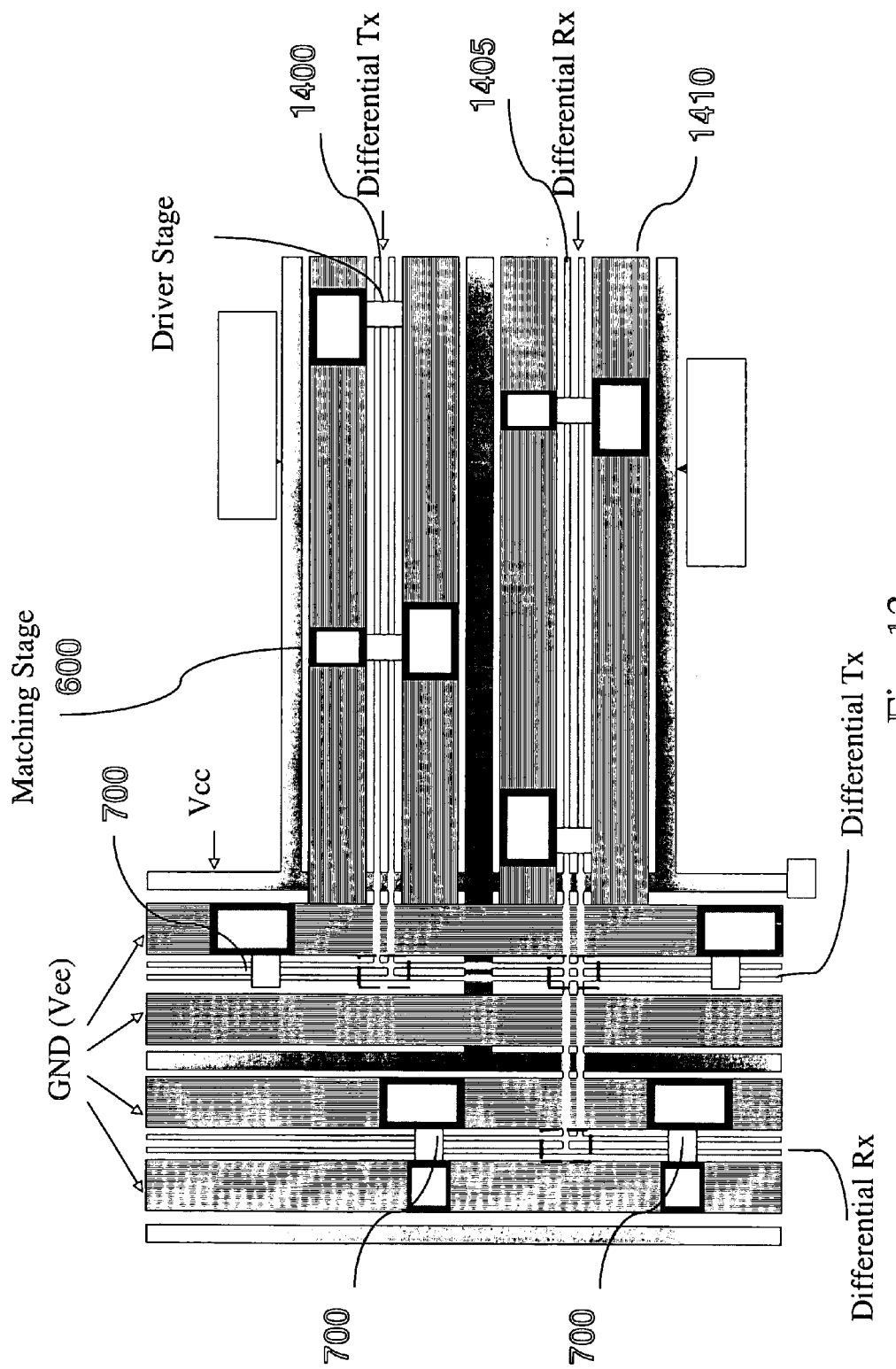

A layout view for a section of RF feed network with respect towards surface 303 of substrate 301 of FIG. 12*a* is illustrated in FIG. 13. In this embodiment, the RF feed network is differential having separate differential transmission coplanar waveguides 1400 and differential receiving coplanar waveguides 1405. For enhanced process quality, the corresponding ground plates 1410 for the waveguides are formed from separate conductive lines rather than solid plates. Driver amplifiers 700 and matching amplifiers 600 are integrated into the substrate (not illustrated) and couple through vias (not illustrated) to the ground plate and the waveguides.

Active circuitry 1310 also forms distributed phase shifters as will be explained further herein. The location of the distributed phase shifters depends upon the granularity desired for the beam steering capability. For example, referring back to FIGS. 4 and 5, each antenna element 170 could receive individual phase shifting through an adjacent and corresponding distributed phase shifter. To save costs and reduce power consumption, subsets of antenna elements 170 may share in the phase shifting provided by a corresponding distributed phase shifter. For example, consider a subset 450 or 550 having sixteen antenna elements 170. As seen in FIG. 4, a distributed phase shifter located adjacent an intersection 460 of network 410 would provide equal phase shifting for each of the elements within subset 450. Similar subsets would have their own distributed phase shifter. Similarly, as seen in FIG. 5, a distributed phase shifter located adjacent an intersection 560 of network 510 would provide equal phase shifting for each of the elements within subset 550 with respected a received RF signal. Thus, it may be appreciated that the granularity of the beam steering capability is a design choice and depends upon desired manufacturing costs and associated complexity.

Figure 14:
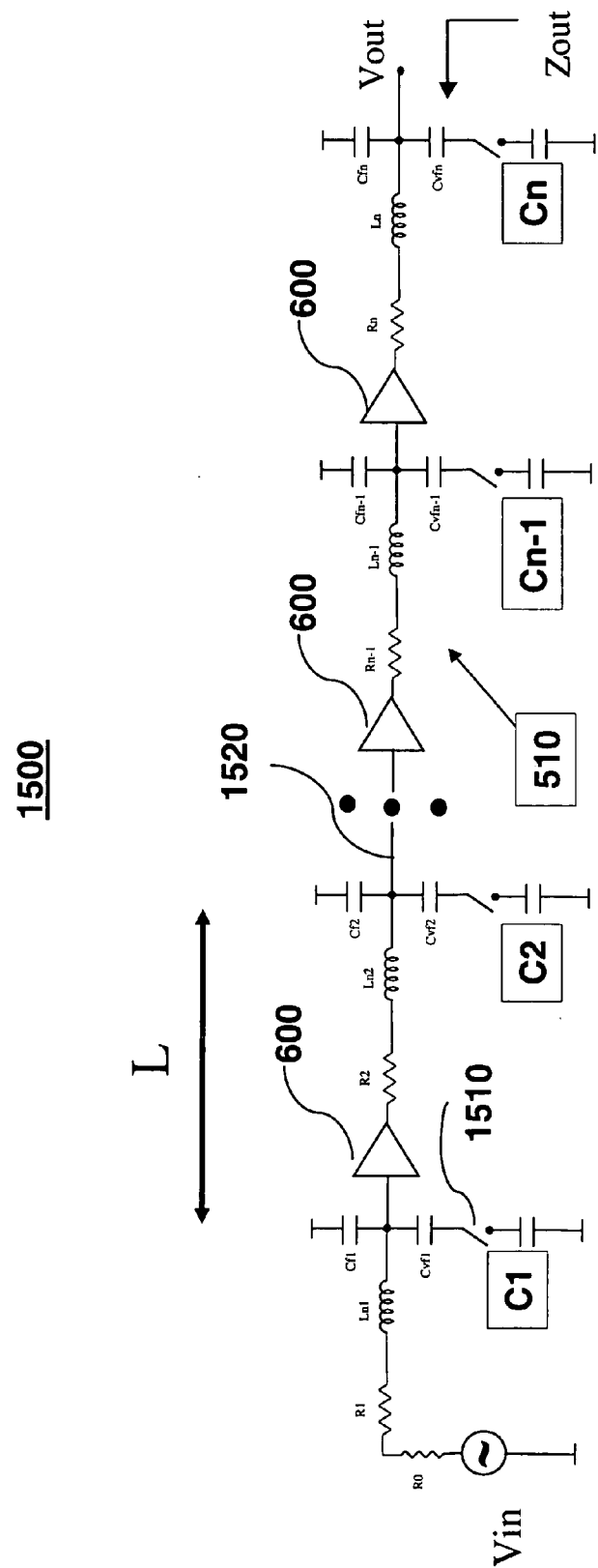
FIG. 14 is a schematic illustration of a distributed amplifier phase shifter in accordance with an embodiment of the invention.

Several embodiments may be used for a distributed phase shifter. For example, as seen in FIG. 14, a distributed amplifier phase shifter 1500 may be implemented using a set of n stages of matching amplifiers 600 and corresponding integrated capacitors C1 though Cn that may be selected through accompanying transistor switches 1510 to load network 510, where n is a positive integer. Referring back to FIG. 6, matching amplifiers 600 would have the inductance value for L2 chosen such that the input impedance approaches infinity. In addition, the inductance ratio between L1 and L2 may be chosen to provide a desired amount of gain such as unity or several dB. The distributed capacitance, resistance, and inductance for network sections 1520 of length L between matching amplifiers 600 is represented by inductances Ln, resistances Rn, and capacitances Cf and Cvf.

It may be shown that the electrical relationship between Vin and Vout for distributed amplifier phase shifter 1500 is given by $$\frac{V_{out}}{V_{in}} = \prod_{i}^{N} g_{mi} \cdot \{R_{pi} + J\omega \cdot Li[L_{pi} - 1/((C_{pi} + C_v i) \cdot \omega^2 \cdot Li^2)]\}$$

where N is the number of capacitor stages, ω is the frequency, L is the length of transmission line in network 510 associated with each capacitor stage, gm is the transconductance for transistor 640, $R_O$ is the CPW resistance per length, $L_O$ is the CPW inductance per length, Cv is the parasitic capacitances of all nodes per length, and Cp is the capacitance for the selected ones of the capacitors C1 through Cn.

It may thus be seen that the selection of the capacitance value for each of the capacitors C1 through Cn depends upon the corresponding distributed impedance of the transmission line segment of length L. Given these variables, a designer may select appropriate values for C1 through Cn such that a desired phase shift range may be achieved. Referring back to FIG. 3, the control from control unit 190 depends upon the number of stages in distributed amplifier phase shifter 1500. For example, if there are eight stages, a 3-bit control signal would determine which capacitors C1 through Cn couple to the CPW transmission line.

By using metal layers M1 and M2 as seen in FIG. 12*b* to form inter-metal (integrated) capacitors C1 through Cn, transistor switch 1510 may couple this capacitor to CPW 1320 through vias V1 through V5. The capacitor metal plates in one of the layers such as layer M2 would be tied to ground. In this fashion, when transistor switch 1510 is conducting, the corresponding capacitor will load CPW 1320. The corresponding capacitor would then load its section of CPW transmission line 1320 through activation of the corresponding transistor switch 1510, which couples to the corresponding metal plate of the capacitor in, for example, metal layer M1.

Figure 15:
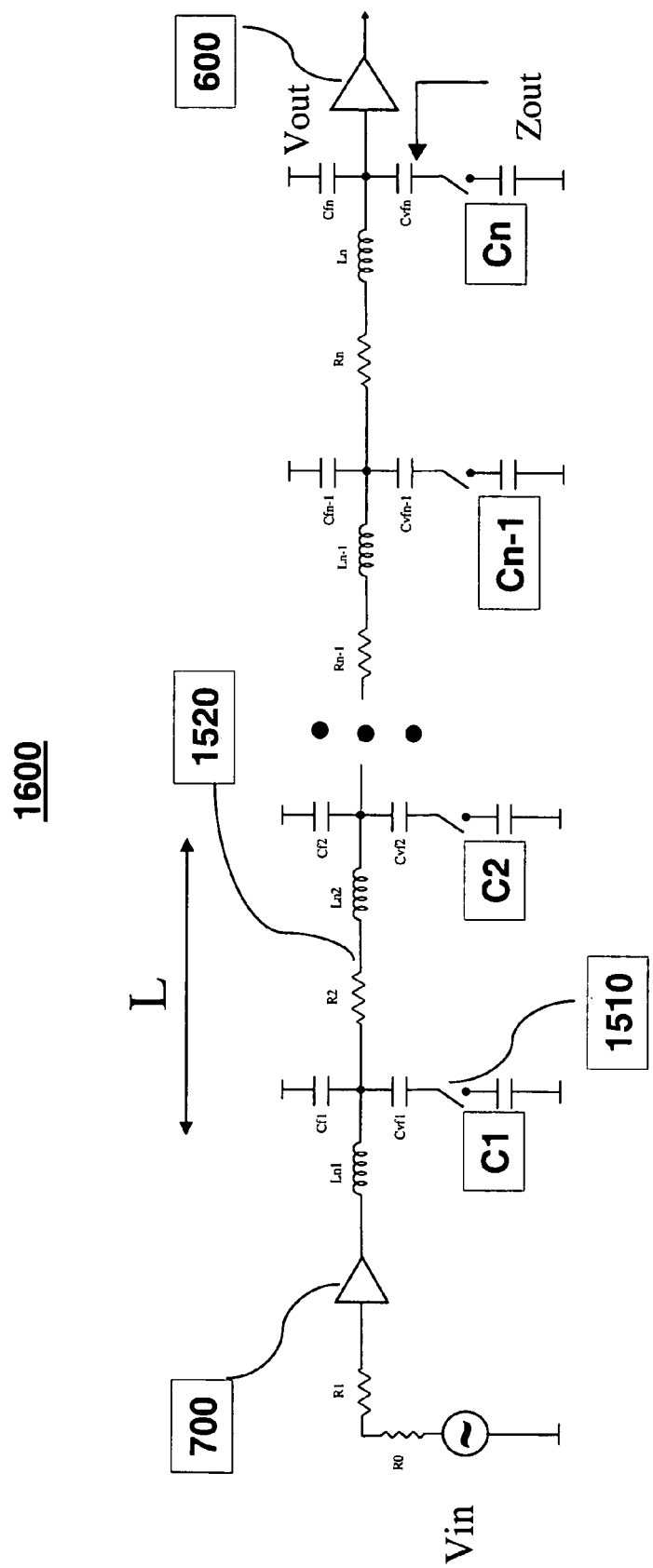
FIG. 15 is a schematic illustration of a distributed capacitor array phase shifter in accordance with an embodiment of the invention.

A simpler but lossy distributed phase shifter 1600 may be constructed as shown in FIG. 15. Phase shifter 1600 does not include a matching amplifier for each stage as discussed with respect to phase shifter 1500. However, phase shifter 1600 includes n stages having integrated capacitors C1 through Cn and corresponding transistor switches 1510. Thus, to accommodate the accompanying losses, phase shifter 1600 may include a driving amplifier 700 and an output amplifier 600.

Figure 16:
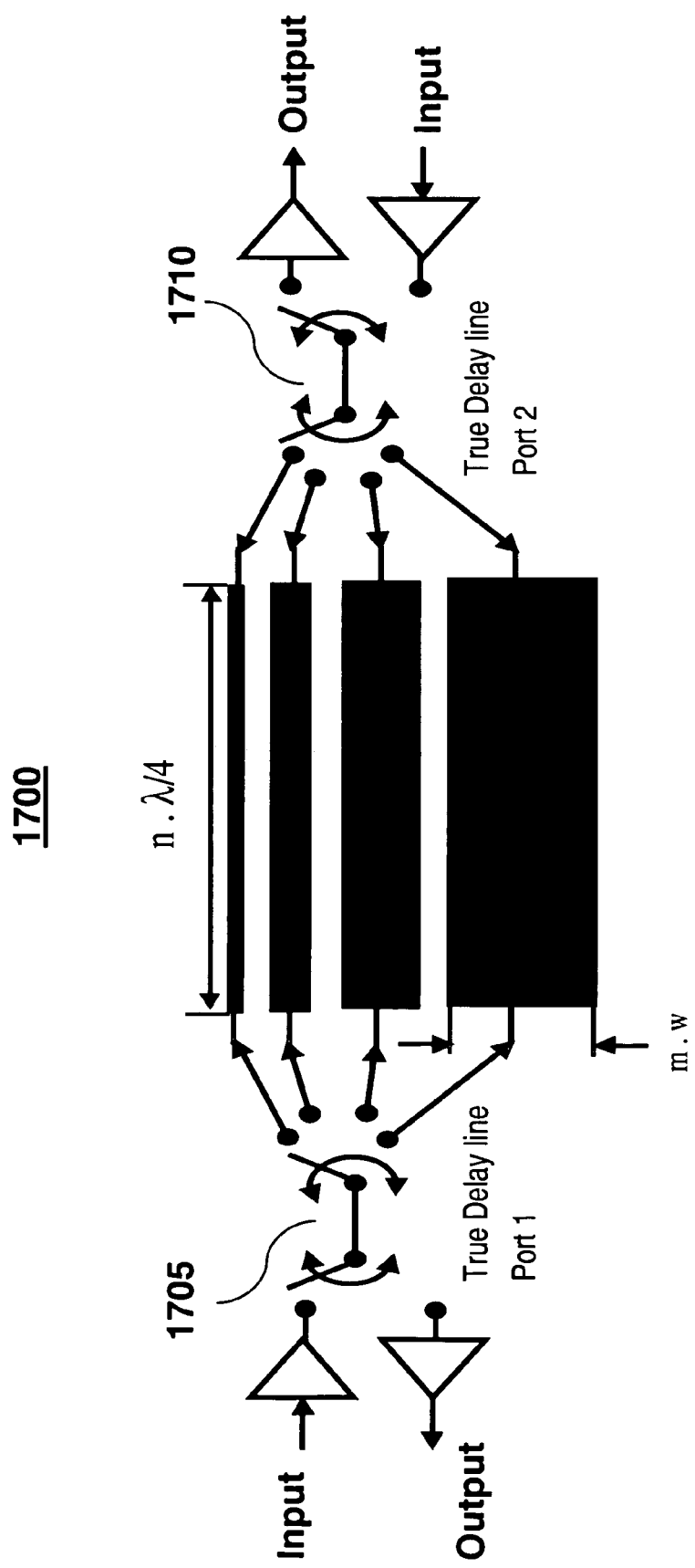
FIG. 16 is a schematic illustration of a distributed delay line phase shifter in accordance with an embodiment of the invention.

In yet another alternative embodiment for a distributed phase shifter, an array of selectable distributed delay lines may be used as shown for delay line phase shifter 1700 of FIG. 16. Transistor-based switches 1705 and 1710 select for the appropriate network input or output. In that regard, it will be appreciated that in a half-duplex design in which the received and transmitted RF signals travel on the same network, the input and output ports would not be separated as seen in FIG. 16. The length of the delay lines is arbitrary and depends upon the desired phase shifts. In the embodiment illustrated, the length for each delay line is an integer multiple of a quarter wavelength for the operating frequency. Each delay line may be formed in a single metal layer or in separate metal layers analogously to capacitors C1 through Cn of FIGS. 14 and 15.

Figure 17:
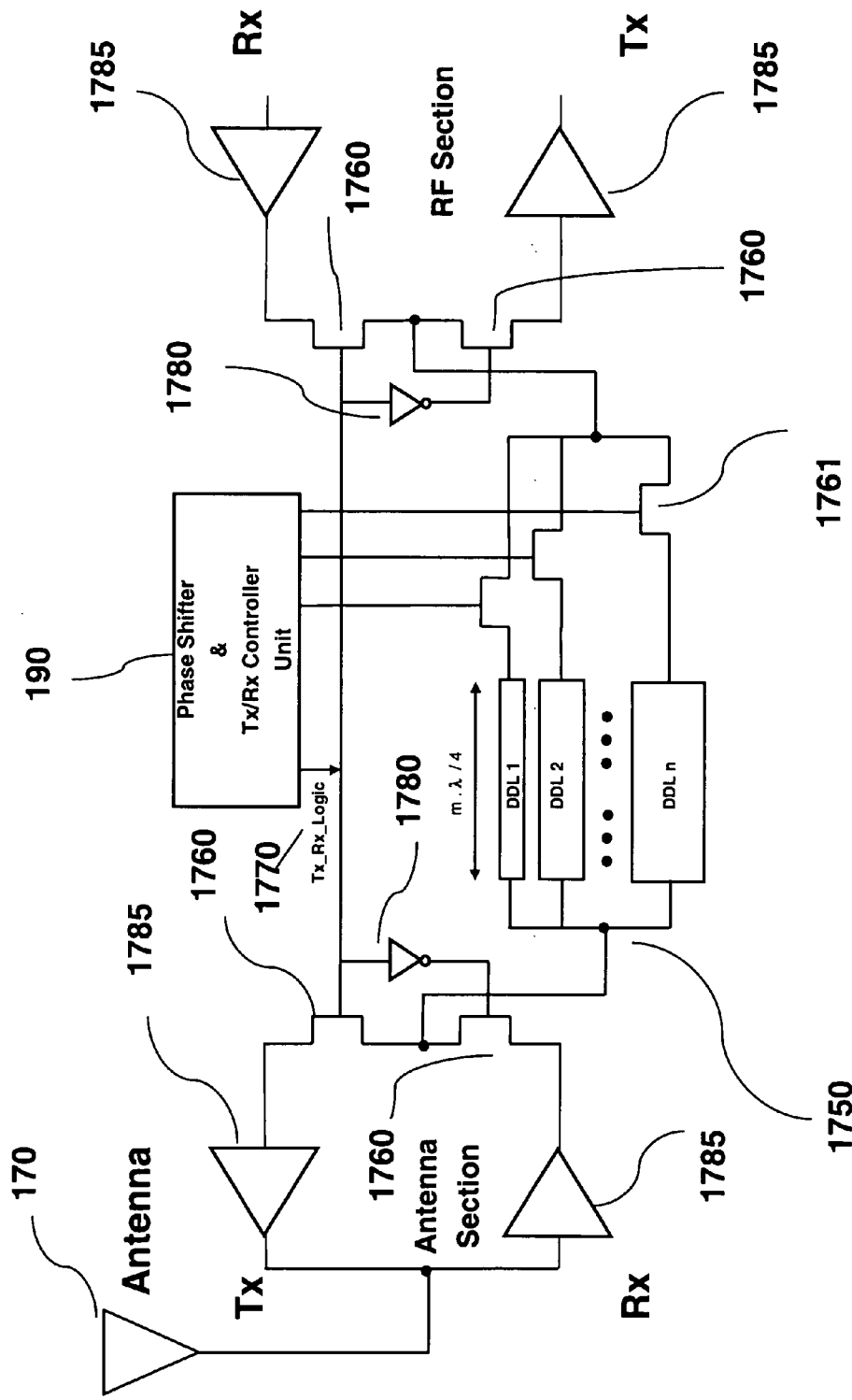
FIG. 17 is a schematic illustration of a distributed delay line phase shifter within an integrated impulse radio transceiver in accordance with an embodiment of the invention.

The control provided by control unit 190 (FIG. 3) to control delay line phase shifter 1700 depends upon the number of selectable delay lines. For example, if there are eight delay lines, a 3-bit control signal would suffice. Although delay line phase shifter 1700 includes switches 1705 and 1710 that may select for only a single delay line, it will be appreciated that multiple delay lines may be selected in parallel as seen for delay line phase shifter 1750 of FIG. 17 using transistor switches 1761. A low power impulse generator may provide a signal to the Rx port so that the signal may be properly delayed through delay line phase shifter 1750. Similarly, a received signal from antenna 170 would be phase shifted by delay line phase shifter 1750 and provided to the Tx port of a corresponding baseband processor. Transistor switches 1760 may be operated by a common control signal 1770 through use of inverters 1780. Amplifiers 1785 provide proper gain through delay line phase shifter 1750 in both the receive and transmit configurations.

It will be appreciated that both driving amplifiers and the matching amplifiers may be constructed using alternative arrangements of bipolar transistors such as PNP bipolar transistors or field effect transistors. Moreover, the RF feed network and these amplifiers may be constructed in either a single ended or differential fashion. DC and control lines may be arranged orthogonally to the RF distribution direction for isolation. In addition, this same orthogonality may be maintained for the RF transmit and receive networks in a full duplex design. It will thus be obvious to those skilled in the art that various changes and modifications may be made without departing from this invention in its broader aspects. The appended claims encompass all such changes and modifications as fall within the true spirit and scope of this invention.

I claim:

1. An integrated circuit antenna array, comprising:
   a substrate,
   a plurality of antennas adjacent the substrate; and
   a plurality of distributed phase shifters, wherein each phase shifter corresponds uniquely to a subset of the antennas and couples to its subset of antennas through a corresponding RF network, and wherein each phase shifter includes a plurality of capacitors coupled to the corresponding RF network through corresponding switches such that if a given one of the switches is activated, the corresponding capacitor will load the corresponding RF feed network and thereby phase shift RF signals on the corresponding RF network.

2. The integrated circuit antenna array of claim 1, wherein the substrate is a semiconductor wafer substrate.

3. The integrated circuit antenna array of claim 1, wherein the corresponding RF networks are implemented using waveguides selected from the group consisting of microstrip waveguides, co-planar waveguides, and planar waveguides.

4. The integrated circuit antenna array of claim 3, wherein the plurality of antennas are adjacent a first surface of the substrate and wherein the corresponding RF networks are co-planar waveguide networks adjacent an opposing surface of the substrate, the plurality of distributed phase shifters being included in active circuitry integrated into the opposing surface.

5. The integrated circuit antenna array of claim 1, wherein the capacitors are inter-metal capacitors formed in metal layers adjacent the opposing surface of the substrate.

6. The integrated circuit antenna array of claim 5, wherein for each phase shifter, the capacitors are separated by lengths of the corresponding coplanar waveguide network, the phase shifter including a plurality of matching amplifiers corresponding to the lengths, each matching amplifier being configured to match an output impedance of its corresponding length of coplanar waveguide to a desired impedance value.

7. The integrated circuit antenna array of claim 6, wherein each matching amplifier couples to an integrated inductor.

8. An integrated circuit antenna array, comprising:
   a substrate,
   a plurality of antennas adjacent the substrate; and
   a plurality of distributed phase shifters, wherein each phase shifter corresponds uniquely to a subset of the antennas and couples to its subset of antennas through a corresponding RF network, and wherein each phase shifter includes a plurality of delay lines coupled to the corresponding RF network through switches such that if a given one of the delay lines is selected by the switches, the corresponding delay line will load the corresponding RF feed network and thereby phase shift RF signals on the corresponding RF network.

9. The integrated circuit antenna array of claim 8, wherein the substrate is a semiconductor wafer substrate.

10. The integrated circuit antenna array of claim 8, wherein the corresponding RF networks are implemented using waveguides selected from the group consisting of microstrip waveguides, co-planar waveguides, and planar waveguides.

11. The integrated circuit antenna array of claim 10, wherein the plurality of antennas are adjacent a first surface of the substrate and wherein the corresponding RF networks are co-planar waveguide networks adjacent an opposing surface of the substrate, the plurality of distributed phase shifters being included in active circuitry integrated into the opposing surface.

12. The integrated circuit antenna array of claim 10, wherein the delay lines are formed in at least one metal layer adjacent the opposing surface of the substrate.

13. The integrated circuit antenna array of claim 10, wherein for each phase shifter, the corresponding delay lines are of different widths.

14. The integrated circuit antenna array of claim 10, further comprising an impulse generator configured to provide an impulse signal to the distributed phase shifters.

* * * * *